US008902965B2

(12) United States Patent
Akhavan et al.

(10) Patent No.: US 8,902,965 B2
(45) Date of Patent: Dec. 2, 2014

(54) PULSE SHAPING FOR GENERATING NFC INITIATOR TRANSMIT WAVEFORM

(71) Applicant: QUALCOMM Incorporated, San Diego, CA (US)

(72) Inventors: Koorosh Akhavan, San Diego, CA (US); Rainer Gaethke, San Francisco, CA (US); Faramarz Sabouri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 15 days.

(21) Appl. No.: 13/800,065

(22) Filed: Mar. 13, 2013

(65) Prior Publication Data

US 2014/0086301 A1 Mar. 27, 2014

Related U.S. Application Data

(60) Provisional application No. 61/706,581, filed on Sep. 27, 2012.

(51) Int. Cl.
| | |
|---|---|
| *H03K 7/08* | (2006.01) |
| *H04L 25/03* | (2006.01) |
| *H04B 5/00* | (2006.01) |
| *H03F 3/217* | (2006.01) |
| *H04L 1/00* | (2006.01) |

(52) U.S. Cl.
CPC ........ *H04L 1/0033* (2013.01); *H04L 25/03828* (2013.01); *H04B 5/0031* (2013.01); *H04B 5/00* (2013.01); *H03F 3/217* (2013.01)
USPC .......................................................... 375/238

(58) Field of Classification Search
CPC ...... H04B 5/00; H04B 5/0031; H04L 1/0033; H04L 25/03828; H03F 3/217
USPC .......................................................... 375/238
See application file for complete search history.

(56) References Cited

U.S. PATENT DOCUMENTS

| | | | | |
|---|---|---|---|---|
| 5,644,311 A | * | 7/1997 | Choudhury et al. | 341/152 |
| 5,764,165 A | * | 6/1998 | Buch | 341/53 |
| 5,774,083 A | * | 6/1998 | Flynn | 341/118 |
| 5,793,808 A | * | 8/1998 | Rowe et al. | 375/238 |
| 7,308,027 B1 | * | 12/2007 | Gaboriau et al. | 375/238 |
| 7,502,594 B2 | | 3/2009 | Ginggen et al. | |
| 7,554,373 B2 | * | 6/2009 | Fujino et al. | 327/175 |

(Continued)

OTHER PUBLICATIONS

International Search Report and Written Opinion—PCT/US2013/061351—ISA/EPO—Feb. 20, 2014.

(Continued)

*Primary Examiner* — Juan A Torres
(74) *Attorney, Agent, or Firm* — Kevin T. Cheatham

(57) ABSTRACT

The present systems and methods may shape signals to meet emission mask requirements, current consumption requirements, and overshoot/undershoot requirements relating to the interaction that, for example, occurs when a near field communications (NFC) target comes within range of an NFC initiator, and the initiator generates and transmits an NFC waveform. In some implementations, a pair of bit patterns are defined whose differential output from an amplifier is a shaped pulse width modulated waveform. Varying individual bits of the bit patterns can vary the shaped pulse waveform with predictability. The pulse width modulated waveform may be filtered using a matching network that reduces higher order harmonics, thereby reducing out-of-band emissions.

30 Claims, 14 Drawing Sheets

(56) References Cited

U.S. PATENT DOCUMENTS

| | | | |
|---|---|---|---|
| 8,294,465 B2 * | 10/2012 | Gudino et al. | 324/318 |
| 2002/0180547 A1 | 12/2002 | Staszewski et al. | |
| 2007/0002943 A1 | 1/2007 | Midya | |
| 2007/0274242 A1 | 11/2007 | Lamacraft et al. | |
| 2008/0074183 A1 | 3/2008 | Tai | |
| 2009/0011706 A1 | 1/2009 | Wilson et al. | |
| 2012/0262214 A1 | 10/2012 | Hori | |

OTHER PUBLICATIONS

Raab F.H, "Class-D power amplifier with RF pulse-width modulation", Microwave Symposium Digest (MTT), 2010 IEEE MTT-S International, IEEE, Piscataway, NJ, USA, May 23, 2010, pp. 924-927, XP031712616.

* cited by examiner

PULSE SHAPING FOR GENERATING NFC INITIATOR TRANSMIT WAVEFORM

CROSS REFERENCE TO RELATED APPLICATIONS

This application claims the benefit of U.S. Provisional Application No. 61/706,581, filed Sep. 27, 2012, entitled "PULSE SHAPING FOR GENERATING NFC INITIATOR TRANSMIT WAVEFORM," the disclosure of which is hereby incorporated by reference in its entirety.

FIELD

This disclosure relates generally to apparatus and methods of wireless communication and radio frequency identification. More particularly, the disclosure relates to pulse shaping apparatus and methods.

BACKGROUND

Near Field Communication (NFC) systems enable short range wireless communications between initiators and targets at 13.56 MHz. Initiators read the RFID tag of targets close to the initiator, using NFC standard protocols, including Proximity types A, B, and F, and Vicinity protocol.

The use of NFC interfaces in electronic equipment provides portable devices with functions similar to those of non-contact integrated circuit cards (e.g., radio frequency identification (RFID) cards). In addition, electronic equipment provided with NFC interfaces may be capable of operating as radio frequency (RF) readers and/or writers to communicate with other NFC devices. A basic aspect of NFC is usage of electromagnetic waves in a RF range and that a transmission of information contents is realized over a short distance only, for instance in a range of several centimeters.

As NFC systems emit more powerful signals to meet operational needs, power consumption increases. Regulatory agencies including FCC and ETSI regulate out-of-band emissions. System, method, and apparatus improvements that reduce out-of-band emissions and/or reduce power consumption are desired.

SUMMARY

Various implementations of systems, methods and devices within the scope of the appended claims each have several aspects, no single one of which is solely responsible for the desirable attributes described herein. Without limiting the scope of the appended claims, some prominent features are described herein.

One innovation includes an apparatus for wireless communications, and certain implementations may include one or more of the features (aspects) described herein. In one implementation, the apparatus includes a memory unit configured to store a plurality of bit patterns, and a first circuit configured to generate a first signal using a first selected one of the plurality of bit patterns. The first circuit may be further configured to generate a second signal using a second selected one of the plurality of bit patterns. The apparatus may further include an amplifier coupled to the first circuit. The amplifier may be configured to generate a pulse width modulated signal at a carrier frequency based on the first signal and the second signal.

In some implementations, the apparatus further includes a second circuit configured to filter higher order harmonics of the pulse width modulated signal. The second circuit may be further configured to generate a near field communications (NFC) transmit signal. For some implementations, the plurality of bit patterns comprises bit patterns that shape the pulse width modulated signal to reduce higher order harmonics of for each protocol, modulation index, and data rate combination.

For some implementations, the apparatus may further include a transmitter that is operationally coupled to the second circuit. The transmitter is configured to transmit the near field communications (NFC) transmit signal. For some implementations, the amplifier is a class D power amplifier. The second circuit may be a matching network filter. For some implementations, each of the plurality of bit patterns contains 32 bits. The selected one of the plurality of bit patterns may be selected based on whether a transmitted coded bit is a zero or a one. For some implementations, the first circuit is configured to select one of the plurality of bit patterns for each cycle of the carrier frequency. The configuration of the first circuit may consume less common mode current for bit patterns with lower duty cycles than would be consumed for bit patterns with higher duty cycles.

For some implementations, the plurality of bit patterns includes bit patterns with a plurality of duty cycles, including at least one bit pattern with a duty cycle under 50%. The plurality of bit patterns may include bit patterns corresponding to different phase steps in the transition a first phase to a second phase. In some implementations, the first circuit may be configured to first select the one of the plurality of bit patterns corresponding to the first phase, then select one of the plurality of bit patterns corresponding to different phase steps in the transition from the first phase to the second phase, and finally select one of the plurality of bit patterns corresponding to the second phase to reduce both undershoot and overshoot in phase transitions.

In some implementations, the near field communications transmit signal is configured to be a Type A Proximity near field communications signal with data rate of carrier frequency divided by 128 and a modulation index of 90% to 100%, or a data rate of carrier frequency divided by 64 and a modulation index of 25% to 100%. In some implementations, the near field communications transmit signal is configured to be a Type A Proximity near field communications signal with data rate of carrier frequency divided by 32 and a modulation index of 25% to 100%. In some implementations, the near field communications transmit signal is configured to be a Type A Proximity near field communications signal with data rate of carrier frequency divided by 16 and a modulation index of 25% to 100%.

In some implementations, the near field communications transmit signal is configured to be a Type B Proximity near field communications signal with a data rate of carrier frequency divided by 128 and a modulation index of 8% to 15% or a data rate of carrier frequency divided by 64 and a modulation index of 8% to 15%. In some implementations, the near field communications transmit signal is configured to be a Type B Proximity near field communications signal with a data rate of a data rate of carrier frequency divided by 32 and a modulation index of 8% to 15%, or in other implementations with data rate of carrier frequency divided by 16 and a modulation index of 8% to 15%.

For some implementations, the near field communications transmit signal is configured to be a Type F Proximity near field communications signal with data rate of carrier frequency divided by 64 and a modulation index of 8% to 14%. For some implementations, the near field communications transmit signal is configured to be a Type F Proximity near field communications signal with data rate of carrier frequency divided by 32 and a modulation index of 8% to 14%.

For some implementations, the near field communications transmit signal is configured to be a Vicinity near field communications signal with data rate of carrier frequency divided by 512 and a modulation index of 10% to 100%. For some implementations, the near field communications transmit signal is configured to be a Vicinity near field communications signal with data rate of carrier frequency divided by 8192 and a modulation index of 10% to 100%.

Another innovation is a method for shaping a signal for near field communications (NFC), including generating a shaped signal, where generating a shaped signal includes storing a plurality of bit patterns, selecting a first bit pattern of the plurality of bit patterns, selecting a second bit pattern of the plurality of bit patterns, and generating a pulse width modulated signal at the carrier frequency based on the first bit pattern and the second bit pattern.

For some implementations, the method for shaping a signal further includes generating a first signal corresponding to the first selected bit pattern, generating a second signal corresponding to the second selected bit pattern, and wherein generating a pulse width modulated signal comprises inputting the first signal and the second signal to an amplifier, and wherein the pulse width modulated signal is an output signal from the amplifier.

For some implementations, the method for shaping signals further includes filtering higher order harmonics of the pulse width modulated signal and generating a near field communications (NFC) transmit signal. For some implementations, the method further includes selecting from the plurality of bit patterns that shape, the pulse width modulated signals to reduce higher order harmonics for each protocol, modulation index, and data rate combination. For some implementations, the method further includes transmitting the near field communications (NFC) signal.

Some implementations further include defining an N-element sequence of phase steps, wherein N exceeds 2. In some examples, the first element may correspond to a first phase and the Nth element may correspond to a second phase. The second through N-1 elements may correspond to different phase steps in the transition from the first phase to the second phase. The second through N-1 elements may increase monotonically when the second phase exceeds the first phase. The second through N-1 elements may decrease monotonically when the second phase is less than the first phase. Some implementations may further include generating a shaped signal for each of the N-element sequence of phase steps. The first bit pattern selected for each phase step and the second bit pattern for each phase step may correspond to the phase step, thereby reducing both undershoot and overshoot in the transition from the first phase to the second phase. N may vary between 3 and 32.

Another innovation is a device for shaping a signal for near field communications (NFC) comprising means for generating a shaped signal, including means for storing a plurality of bit patterns. The device further includes means for selecting a first bit pattern of the plurality of bit patterns and means for generating a first signal corresponding to the first selected bit pattern. The device further includes means for selecting a second bit pattern of the plurality of bit patterns and means for generating a second signal corresponding to the second selected bit pattern. The device further includes means for generating a pulse width modulated signal at the carrier frequency based on the first waveform and the second waveform.

In some implementations, one or more memory units store the plurality of bit patterns. A first circuit selects the first bit pattern of the plurality of bit patterns. The first circuit generates the first signal corresponding to the first selected bit pattern. The first circuit selects the second bit pattern of the plurality of bit patterns. The first circuit generates the second signal corresponding to the second selected bit pattern. An amplifier generates a pulse width modulated signal at the carrier frequency based on the difference between the first waveform and the second waveform.

In some implementations, the device further comprises means for filtering the second circuit higher order harmonics of the pulse width modulated signal, and means for generating a near field communications (NFC) transmit signal from the pulse width modulated signal. In some implementations, a second circuit filters higher order harmonics, and generates a near field communications (NFC) transmit signal.

Another innovation is a non-transitory computer-readable medium comprising code that, when executed, causes an apparatus to generate a shaped signal, and certain implementations may include one or more of the features described herein. For example, the code, when executed, causes a memory unit to store a plurality of bit patterns, select by a first circuit a first bit pattern of the plurality of bit patterns, generate by a first circuit a first signal corresponding to the first selected bit pattern, select by a first circuit a second bit pattern of the plurality of bit patterns, generate by a first circuit a second signal corresponding to the second selected bit pattern, and generate by an amplifier a pulse width modulated signal at the carrier frequency based on the first signal and the second signal.

For some implementations, the non-transitory computer-readable medium further includes code that, when executed, causes the apparatus to filter by a second circuit higher order harmonics of the pulse width modulated signal, and generate by the second circuit a near field communications (NFC) transmit signal. For some implementations, the plurality of bit patterns comprises bit patterns that shape the pulse width modulated signal to reduce higher order harmonics for each protocol, modulation index, and data rate combination.

Another innovation is a processor for wireless communications, and certain implementations may include one or more of the features described herein. In one example, the processor includes a memory unit configured to store a plurality of bit patterns, and circuitry configured to generate a first signal corresponding to a first selected one of the plurality of bit patterns and further configured to generate a second signal corresponding to a second selected one of the plurality of bit patterns. The circuitry can include hardware and/or software components. The processor may further include an amplifier coupled to the circuitry, the amplifier configured to generate a pulse width modulated signal at a carrier frequency based on the first signal and the second signal. The amplifier may include hardware and/or software components.

Details of one or more implementations of the subject matter described in this specification are set forth in the accompanying drawings and the description below. Other features, aspects, and advantages become apparent from the description, the drawings, and the claims. Note that the relative dimensions of the following figures may not be drawn to scale.

Figure 1:
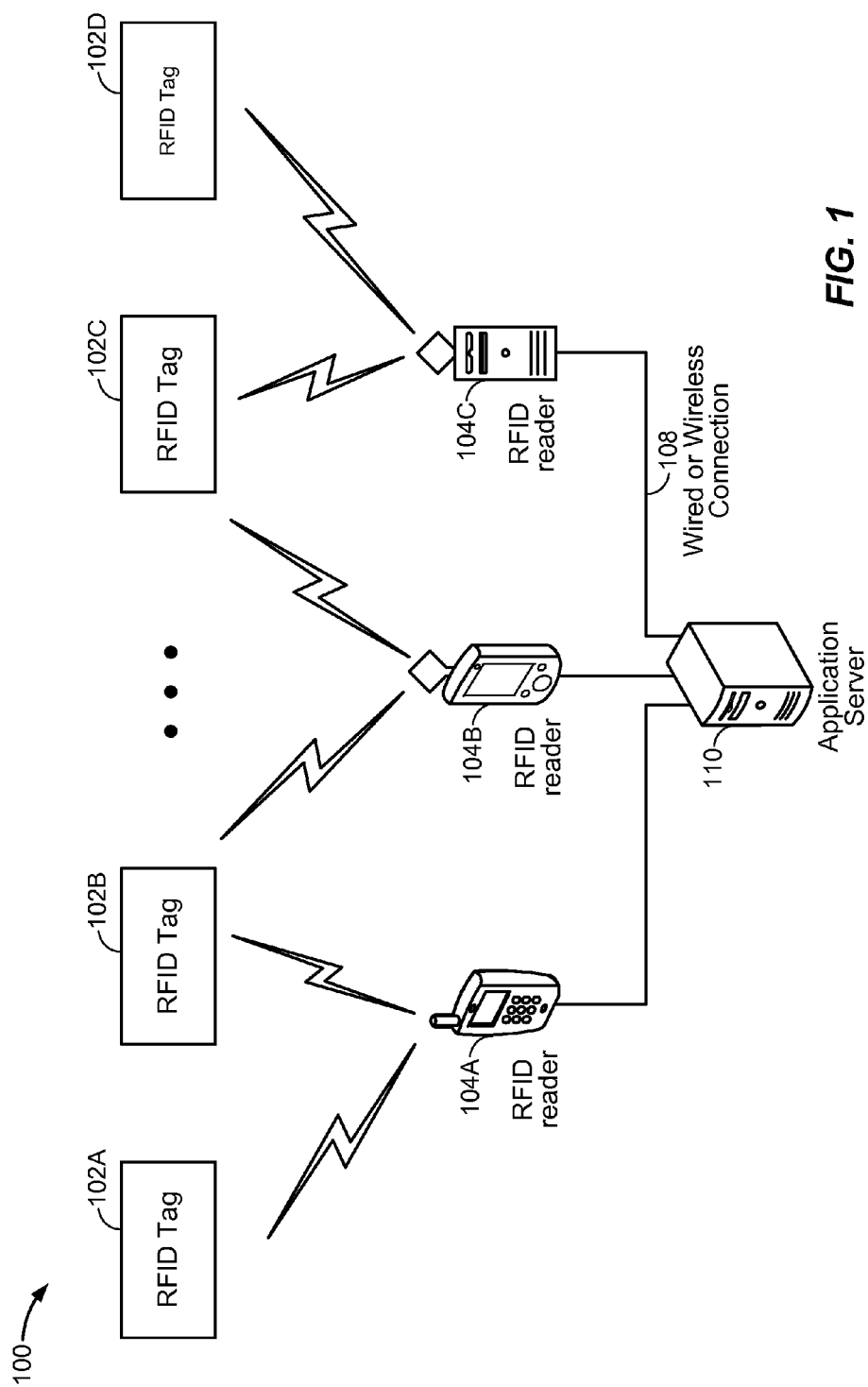
FIG. 1 is a schematic illustrating an example of a communication system, for example, a RFID or NFC system.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary implementations of the disclosure and is not intended to represent the only implementations in which the disclosure may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations of the disclosure. In some instances, some devices are shown in block diagram form.

While for purposes of simplicity of explanation, the methodologies may be shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

As Near Field Communication (NFC) systems emit more powerful signals to meet operational needs, power consumption increases. Regulatory agencies including FCC and ETSI regulate out-of-band emissions. This disclosure introduces devices and methods to meet emission requirements, current consumption requirements, and overshoot/undershoot requirements by reducing out-of-band emissions, reducing current consumption by spectral shaping, controlling transition ramp up/ramp down, and controlling duty cycles.

One innovation disclosed is a flexible approach to spectral shaping. Once a designer determines an optimal spectral shape for a set of operational parameters, the system, methods, and apparatus introduced herein enable generation of the optimal spectral shape. Pairs of bit patterns may be defined such that a differential output from an amplifier, having the pair of bit patterns as input signals, is a desired shaped pulse width modulated waveform. Varying individual bits vary signal shape with predictability. The pulse width modulate waveform may be filtered using a matching network that reduces higher order harmonics, thereby reducing out-of-band emissions. This approach of shaping pulse width modulated signal pairs and filtering using a matched network to reduce higher order harmonics enables efficient spectral shaping.

Such methods of generating pulse width modulated waveforms may be used in conjunction with a fixed method of filtering using matching network that reduces higher order harmonics. Signals with reduced higher order harmonics may emit lower out-of-band emissions.

Signal overshoot and signal undershoot occur during transitions to a new value. Signals overshoot when their value exceeds the new value during the transition. Signals undershoot when their value is less than the new value during the transition. Overshoot and undershoot may be minimized with more gradual transitions to new values, using longer transition (ramp up or ramp down) times. Different signal shapes result in different overshoot and undershoot characteristics. The disclosure also describes mechanisms to reduce signal overshoot and undershoot through spectral shaping that controls the phase value ramp up and ramp down time. The overshoot and undershoot behavior can also be reduced by controlling the delay time between the low and high modulation index of the amplitude modulated signal.

Advantages of optimizing the duty cycle for a given signal shape may include lower current consumption and reducing harmonics that contribute to out-of-band emissions.

Near Field Communication (NFC) systems enable short range wireless communications between initiators and targets at, for example, 13.56 MHz. Initiators read the RFID tag of targets close to the initiator, using NFC standard protocols, including Proximity types A, B, and F, and Vicinity protocol. Some examples of technology types and a corresponding data rate and modulation index are shown in Table 1 (below).

TABLE 1

Supported technology types, data rates and modulation indexes

| Type | Data Rate (kbps) | Modulation index |
|---|---|---|
| A | $f_c/128$ = 105.9375 | 90% to 100% |
| A | $f_c/64$ = 211.875 | 25% to 100% |
| A | $f_c/32$ = 423.75 | 25% to 100% |
| A | $f_c/16$ = 847.5 | 25% to 100% |
| B | $f_c/128$ = 105.9375 | 8% to 15% |
| B | $f_c/64$ = 211.875 | 8% to 15% |
| B | $f_c/32$ = 423.75 | 8% to 15% |
| B | $f_c/16$ = 847.5 | 8% to 15% |
| F | $f_c/64$ = 211.875 | 8% to 14% |
| F | $f_c/32$ = 423.75 | 8% to 14% |
| Vicinity | $f_c/512$ = 26.484375 | 10% and 100% |
| Vicinity | $f_c/8192$ = 1.6552734375 | 10% and 100% |

FIG. 1 is a schematic block diagram of an RFID or NFC system 100. The RFID system 100 includes a plurality of RFID tags 102A-D, a plurality of RFID readers 104A-C and an application server 110. The RFID tags 102A-D may each be associated with a particular object for a variety of purposes including, but not limited to, tracking inventory, tracking status, location determination, assembly progress, etc. The RFID tags 102A-D may be active devices that include internal power sources or passive devices that derive power from the RFID readers 104A-C.

Each RFID reader 104A-C may wirelessly communicate with one or more RFID tags 102A-D within its coverage area. For example, the RFID tags 102A and 102B may be within a coverage area of the RFID reader 104A, the RFID tags 102B and 102C may be within a coverage area of the RFID reader 104B, and the RFID tags 102C and 102D may be within a coverage area of the RFID reader 104C. In one implementation, a RF communication mechanism between the RFID readers 104A-C and the RFID tags 102A-D is a backscatter technique whereby the RFID readers 104A-C request data from the RFID tags 102A-D via an RF signal, and the RF tags 102A-D respond with the requested data by modulating and backscattering the RF signal provided by the RFID readers 104A-C. In another implementation, the RF communication mechanism between the RFID readers 104A-C and RFID tags 102A-D is an inductance technique whereby the RFID readers 104A-C communicate with the RFID tags 102A-D via an RF signal to access the data on the RFID tags 102A-D. In either implementation, the RFID tags 102A-D provide the requested data to the RFID readers 104A-C on the same RF carrier frequency as the RF signal.

In this manner, the RFID readers 104A-C may collect data (or information) as may be requested from the application server 110 from each of the RFID tags 102A-D within its coverage area. The collected data is then conveyed to the application server 110 via a wired or wireless connection 108 and/or via possible communication mechanism, for example, a peer-to-peer communication connection. In addition, and/or in the alternative, the application server 110 may provide data to one or more of the RFID tags 102A-D via the associated RFID reader 104A-C. Such downloaded information is application dependent and may vary greatly. Upon receiving the downloaded data, the RFID tag can store the data in a non-volatile memory therein.

In another implementation, the RFID readers 104A-C may optionally communicate on a peer-to-peer basis such that each RFID reader does not need a separate wired or wireless connection 108 to the application server 110. For example, the RFID reader 104A and the RFID reader 104B may communicate on a peer-to-peer basis utilizing a back scatter technique, a wireless LAN technique, and/or any other wireless communication technique. In this instance, the RFID reader 104B may not include a wired or wireless connection 108 to the application server 110. In implementations in which communications between the RFID reader 14A-C and the application server 110 are conveyed through the wired or wireless connection 108, the wired or wireless connection 108 may utilize any one of a plurality of wired standards (e.g., Ethernet, fire wire, et cetera) and/or wireless communication standards (e.g., IEEE 802.11x, Bluetooth, et cetera).

The RFID system of FIG. 1 may be expanded to include a multitude of RFID readers 104A-C distributed throughout a desired location (for example, a building, office site, et cetera) where the RFID tags may be associated with equipment, inventory, personnel, et cetera. In addition, the application server 110 may be coupled to another server and/or network connection to provide wide area network coverage.

Figure 2:
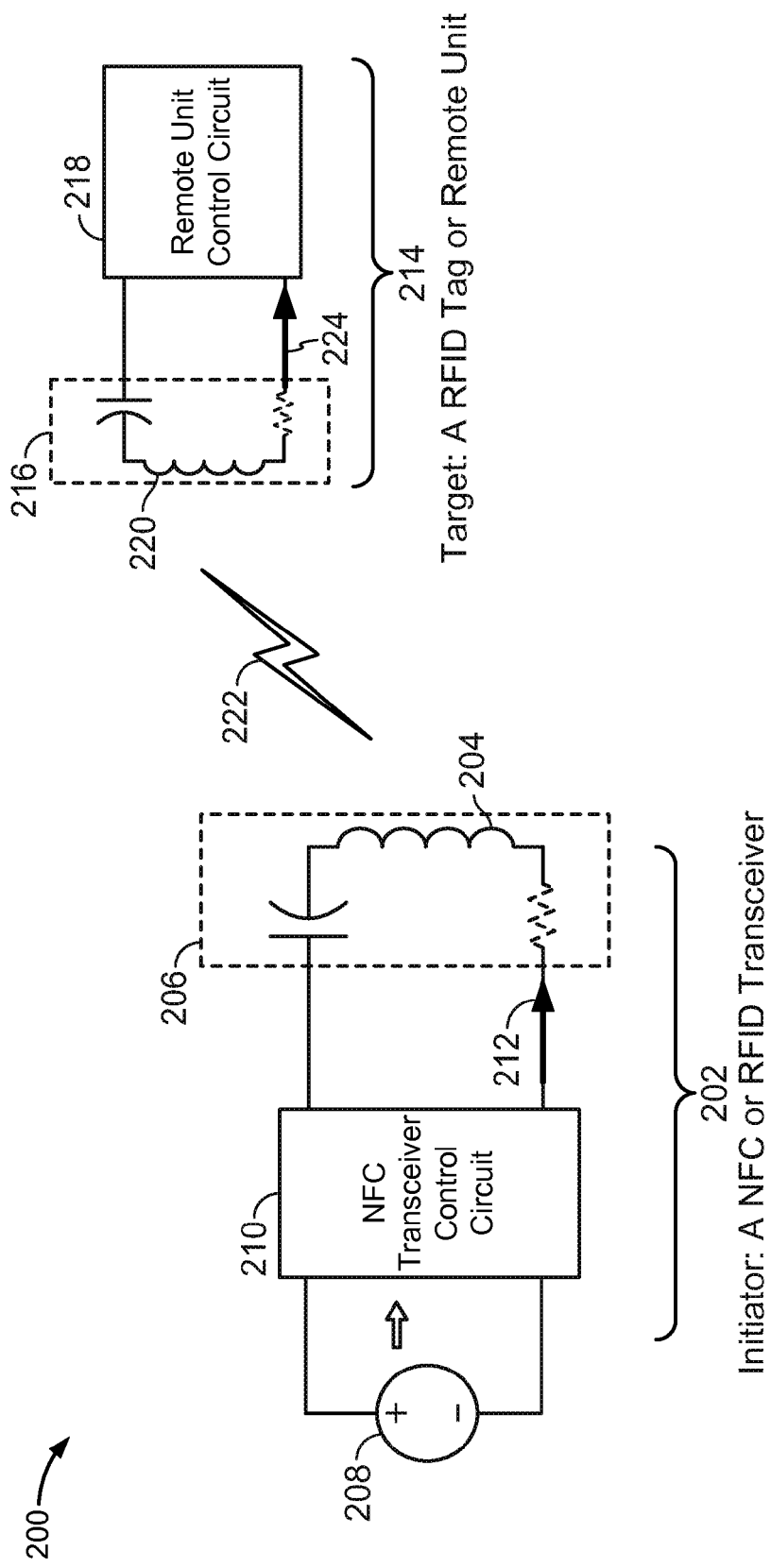
FIG. 2 is a block diagram illustrating an example of a system having an initiator and a target.

FIG. 2 illustrates an exemplary schematic block diagram of a RFID or NFC system 200. The RFID system 200 comprises a RFID transceiver (or initiator) 202 and remote unit (target) 214 such as an RFID tag. The RFID transceiver 202 may comprise a powered reader control circuit 210, which is connected to one or more transceiver loops 204. The transceiver loops 204 are referred herein as coils or loop antennae made of conductive material, i.e., an electromagnetic coil, through which an AC current 212 can flow. The transceiver loops 204 may be circular, oval, and the like, although other sizes and shapes are possible. The AC current 212 flowing through the transceiver loops 204 can result in the transmitting of magnetic energy or magnetic flux 222 at a various frequencies (e.g., 100 kHz to 20 MHz). The wavelength of the emitted frequencies may be much longer than the size of loops 204 on the RFID transceiver 202.

If remote unit 214 is close enough to RFID transceiver 202, magnetic flux 222 from transceiver 202 can get AC coupled onto one or more remote unit loops 220 of conductive material in remote unit 214. Remote unit 214 can be an unpowered device (i.e., without a battery 208 or other means of applying continuous power) having an electromagnetic coil and remote unit control circuit 218. Within remote unit control circuit 218, oscillating current 224 flowing in alternating directions can be rectified by a rectifying diode which can cause a voltage to be built up across a bypass capacitor. Once the bypass capacitor has built up a sufficient voltage, the remote unit control circuit 218 can become powered up and operational. By receiving coupled and modulated AC signal 222 from the RFID transceiver 202, the remote unit can receive and detect information (e.g., commands) from the RFID transceiver.

Once operational, the remote control circuit 218 may also send signals back to RFID transceiver 202 by changing the impedance seen by remote unit loops 220. This can be accomplished by shunting or opening remote unit loops 220 with effectively a switch. If remote unit 214 is close enough to reader 202, the modulated electromagnetic field generated by remote unit loops 220 in the remote unit can be coupled back onto reader loops 204 of the RFID transceiver 202. The signals sent back to the RFID transceiver can be slow and on the order of 100 bits of data, and provide information back to the transceiver 202 such as the serial number or model number of the device to which the remote unit is attached, credit card number, personal identification information, security codes and passwords, and the like.

Figure 3:
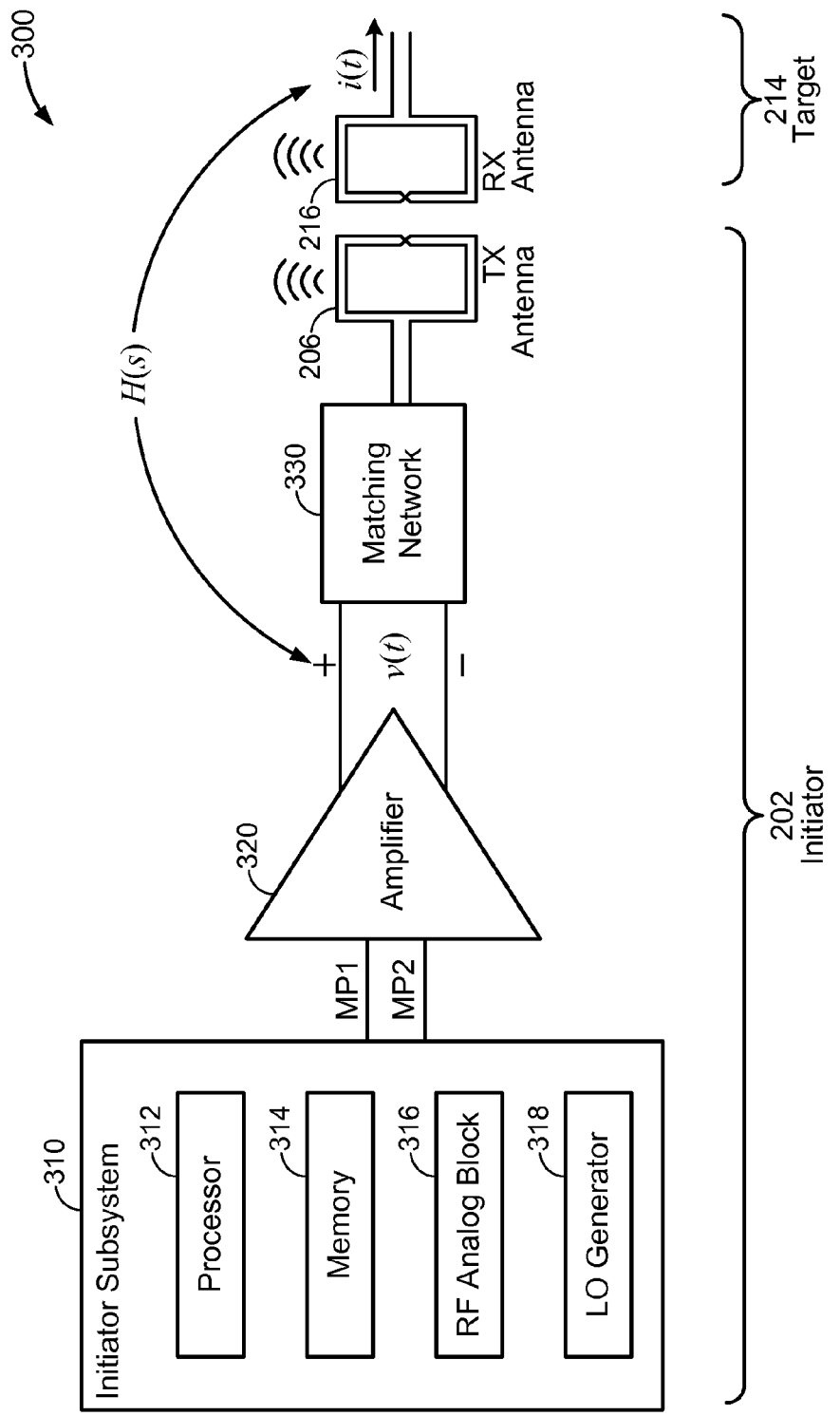
FIG. 3 is a schematic illustrating certain details of an example of an initiator.

FIG. 3 is a schematic illustrating certain details of an example of an initiator, for example, initiator 202 of FIG. 2. When a target 214 comes within range of initiator 202, the initiator generates and transmits an NFC Initiator Transmit Waveform to establish communications with the target 214. Conventional systems first generate two periodic pulses of 50% duty cycle at the carrier frequency, offset by a phase value based on whether a high or low carrier level will be transmitted. An amplifier 320 (e.g., a class-D power amplifier) receives the periodic pulses and generates a pulse width modulated waveform. A matching network 330 receives and filters the modulated waveform, acting as a bandpass filter around the NFC carrier frequency. The initiator 202 transmits the resultant NFC Initiator Transmit Waveform to the target 214.

Certain implementations use periodic pulses of 50% duty cycle with static phase values to generate NFC Initiator Transmit Waveforms, which may be problematic at least in some instances. For example, the resultant NFC Initiator Transmit Waveforms are not optimized by protocol, modulation index, or data rate. Harmonic content at the output of the class-D amplifier is higher than it would be for different signal shapes. The class-D amplifier could consume more current than would be consumed with a lower duty cycle. The NFC Initiator Transmit Waveforms exhibit both overshoot and undershoot behavior during phase transitions. The overshoot and undershoot behavior may be reduced through spectral shaping that controls the phase value ramp up and ramp down time. The overshoot and undershoot behavior may also be reduced by controlling the delay time between the low and high modulation index of the amplitude modulated signal.

Figure 4:
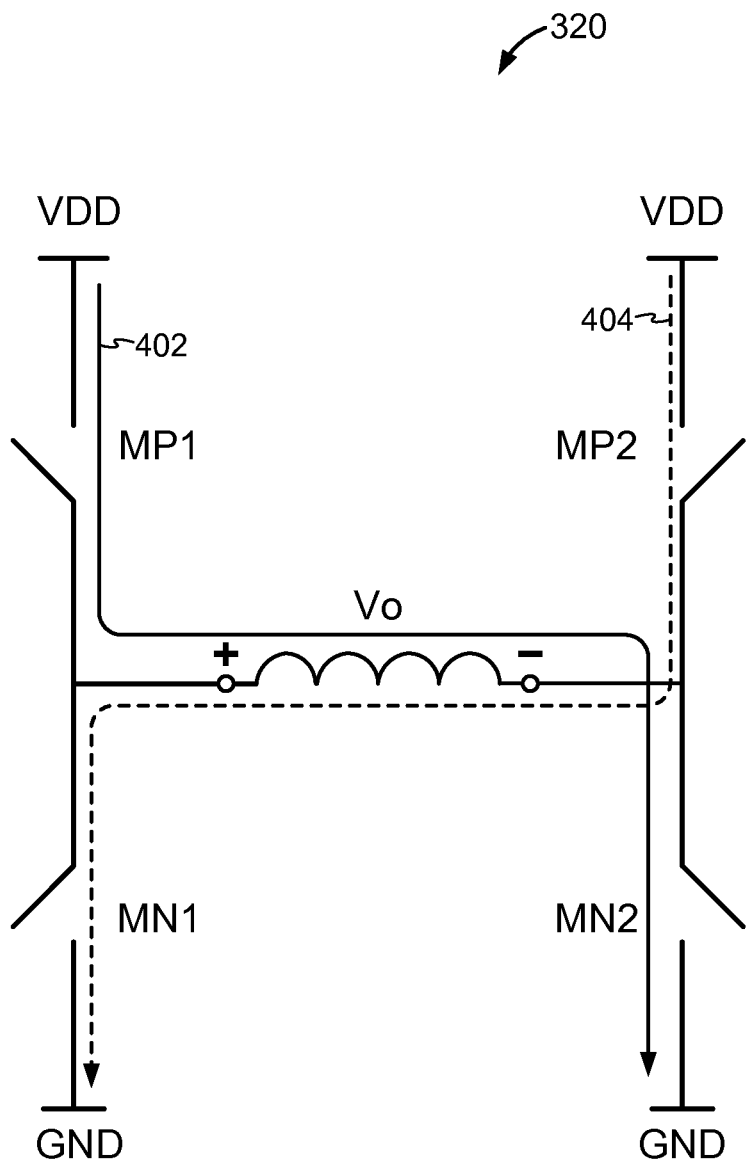
FIG. 4 is a schematic illustrating an example of an implementation of a class D power amplifier switching circuit.
Figure 5:
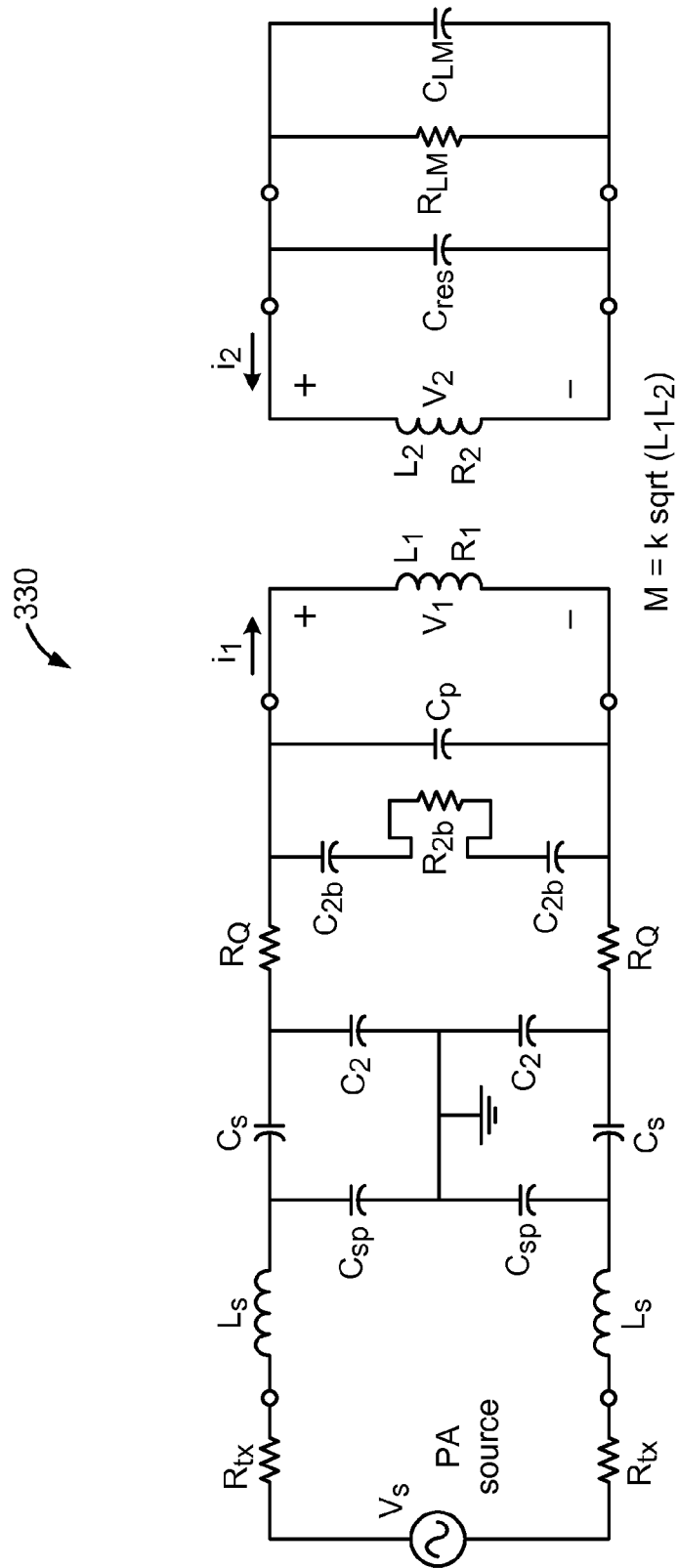
FIG. 5 is a schematic illustrating an example of an implementation of a matching network.

In certain implementations, amplifier 320 receives pulses from initiator subsystem 310 and generates a pulse width modulated waveform output signal. FIG. 4 is an exemplary representation of an amplifier. A matching network 330 receives and filters the pulse width modulated waveform, acting as a bandpass filter around the NFC carrier frequency. FIG. 5 is a schematic of an implementation of an exemplary matching network. The initiator's 202 transmit antenna 206 transmits the resultant NFC Initiator Transmit Waveform to the target's 214 receive antenna 216.

Implementations may include a system and method for pulse shaping for NFC Initiator Transmit Waveforms. Bit patterns may be stored in memory 314. Memory 314 may comprise addressable memory units. The one or more look-up tables, or another data structure, may be stored in the memory 314. As used herein, memory may also refer to a structure that holds information (e.g., a file, a look-up table, a database) and is not limited to being used in reference to a physical memory device.

A first bit pattern (MP1) contains a bit for a time-slice of a cycle of the waveform. For some implementations, cycles are divided into 32 time slices, resulting in 32 bits. Bits values of 1 or 0 correspond to amplitudes of +1 or 0 at that time slice. When a second corresponding bit pattern (MP2) with corresponding time slices is subtracted from the first bit string, the resulting signal may have one of three values at each time slice: +1, 0, or −1. By providing this mechanism to store pairs of bit string patterns, any sequence of (+1, 0, −1) may be generated and input into the amplifier. Also, this provides a flexible mechanism to shape pulse patterns input to the amplifier 320, which enables shaping of the NFC Initiator Transmit Waveforms as desired for each cycle of the carrier frequency.

Different bit patterns may be selected for different cycles. This enables generation of Initiator Transmit Waveforms with gradual transitions between symbols or phase transitions. For example, a sequence of bit patterns maybe stored in memory 314 including each of the bit patterns corresponding to different phase steps that may be used to transition from a first phase to a second phase. Then, a processor 312 can select each of the these bit patterns in sequential cycles to generate a waveform that has desired transition shape for gradual transitions. For some implementation, memory 314 comprises a look-up table.

Memory 314 having look-up tables containing bit patterns to generate inputs to amplifier 320 enables mitigation of certain problems identified with conventional methods. The resultant NFC Initiator Transmit Waveforms may be optimized by protocol, modulation index, or data rate by optimizing bit patterns for each protocol, modulation index, and data rate combination. Harmonic content at the output of the class-D amplifier 320 is reduced by shaping the signal to reduce higher order harmonics, thereby reducing out-of-band transmissions. Accordingly, it may easier to meet FCC/ETSI out-of-band emission requirements. The amplifier 320 may consume a low amount of current by properly shaping pulses and introducing a lower duty cycle. The overshoot and undershoot behavior may be reduced through time series spectral shaping that controls ramp up and ramp down time, and controlling the delay time between the low and high modulation index of the amplitude modulated signal.

In some implementations, the pulses generated by the initiator subsystem 310 all have a frequency equal to the carrier frequency of 13.56 MHz. Waveforms transmitted by the initiator's 202 transmit antenna conform to NFC Digital Protocol Technical Specifications. Waveforms transmitted by the initiator's 202 transmit antenna conform to ISO/IEC specification for proximity NFC and vicinity NFC.

For some implementations, the initiator subsystem 310 uses a clock that runs at $32f_c$ ($f_c$=13.56 MHz is the carrier frequency) to generate the desired input clocks MP1 and MP2 (signals formed from bit patterns MP1 and MP2) at $f_c$ to the amplifier shown in FIG. 4. It also generates LO signals to demodulate load modulated (LM) received signals.

Figure 8:
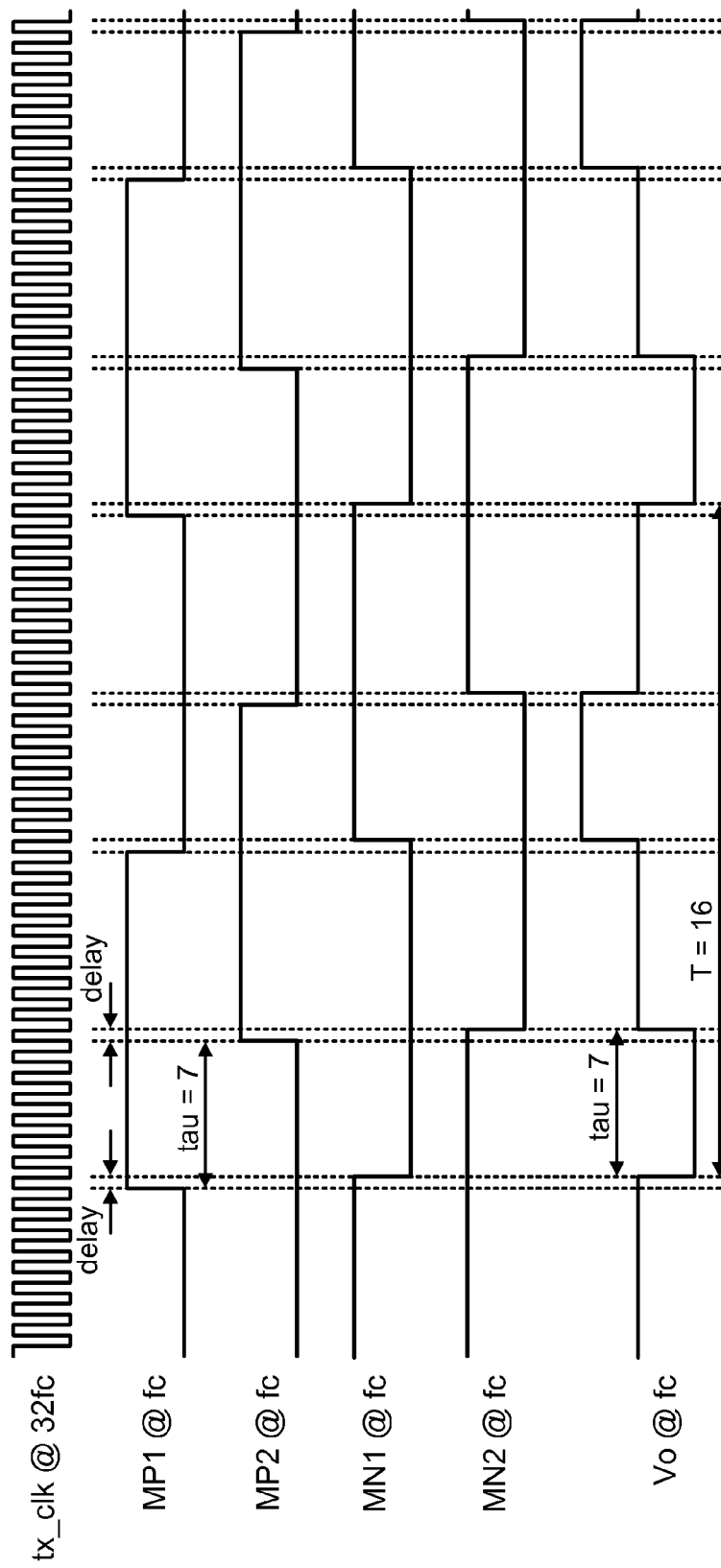
FIG. 8 illustrates an example of a generation of a pulse wave modulated signal $V_O$ over a cycle of the carrier frequency, with inputs MP1, MP2, MN1, and MN2.
Figure 9:
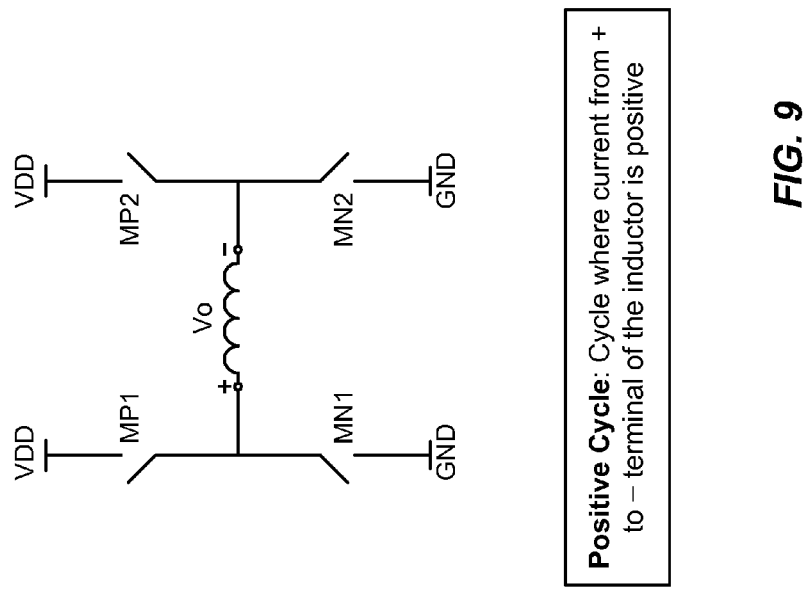
FIG. 9 is a timing diagram illustrating the four power amplifier states that are driven by the input clocking signals MP1, MP2, MN1, and MN2, according to some embodiments.
Figure 9:
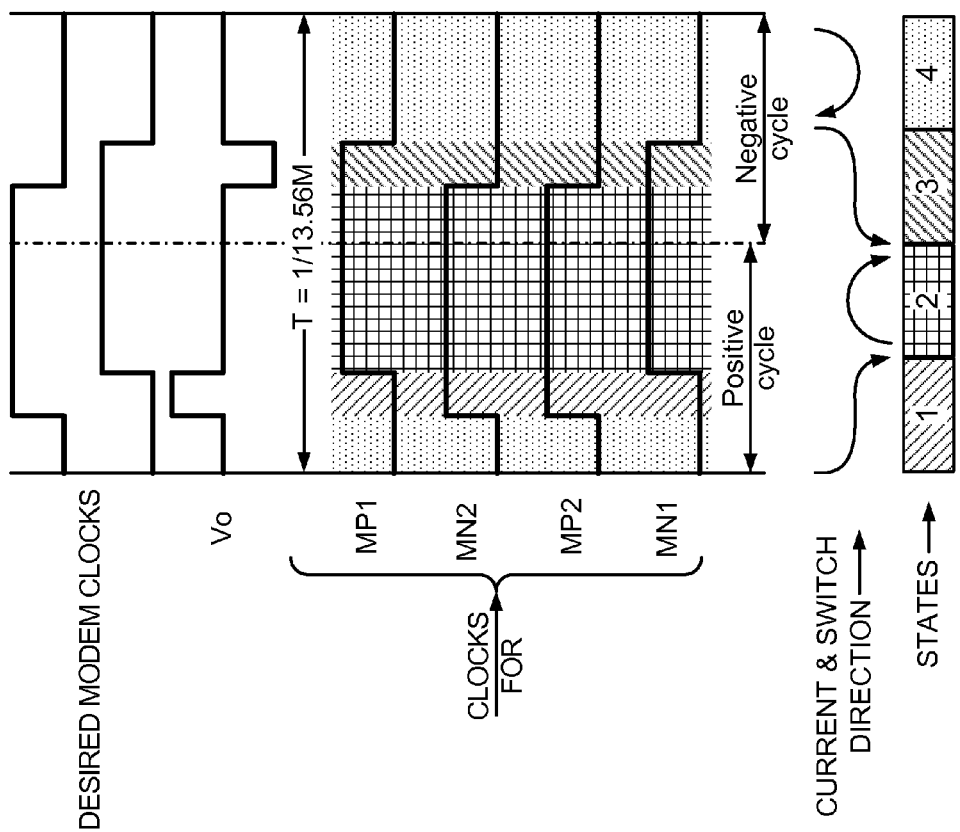

Still referring to FIG. 4, the input clocks MN1 and MN2 may be generated from signals MP1 and MP2 inside RF Analog block 316 as illustrated in FIGS. 8 and 9. The amplifier 320 uses these four inputs to generate a pulse width modulated signal. Generating non-overlapping clocks to generate MN1 and MN2 out of MP1 and MP2 avoids shoot through currents.

For some implementations, signals MP1 and MP2 are generated inside the initiator subsystem 310. The processor 312 pulls out 32-bit bit patterns from memory 314, that in some implementations contain sixteen available locations for a given symbol value, and operating condition. The location or address from which the bit pattern is pulled out depends on whether the transmitted coded bit is a zero or a one.

Every transmitted bit is mapped to a coded bit. The coded bits are chosen from memory 314. Table 2 shows how the processor 312 chooses coded bits based on the data rate and proximity modulation types. The coded bits can be inverted depending when in reverse polarity mode.

TABLE 2

| Coded bits for Proximity types A, B and F | | | | |
|---|---|---|---|---|
| Proximity Type | Previous Bit | Bit | Coded Bit | $N_{cb}$ (per bit) |
| A | 0 | 0 | 0111 | 4 |
|  | 1 | 0 | 1111 | 4 |
|  | x | 1 | 1101 | 4 |
| B | x | 0 | 0 | 1 |
|  | x | 1 | 1 | 1 |
| F | x | 0 | 01 | 2 |
|  | x | 1 | 10 | 2 |

For example, $f_b$ may denote the bit rate and $f_{cb}$ may denote the coded bit rate. Then, $f_{cb}=N_{cb}f_b$, where $N_{cb}$ is the number of coded bits per bit and $$f_b = \frac{f_c}{D}.$$

D is the bit rate divisor that takes on values of 128, 64, 32 or 16 depending on data rate. The number of cycles N per coded bit can be obtained using the relationship $$N = \frac{f_c}{f_{cb}} = \frac{D}{N_{cb}}.$$

Table 3 lists the value of N for various proximity types and data rates.

TABLE 3

Number of cycles N as a function of D and $N_{cb}$

| Data Rate (kbps) | Type A ($N_{cb} = 4$) | Type B ($N_{cb} = 1$) | Type F ($N_{cb} = 2$) |
|---|---|---|---|
| 105.9375 (D = 128) | 32 | 128 | N/A |
| 211.8750 (D = 64) | 16 | 64 | 32 |
| 423.7500 (D = 32) | 8 | 32 | 16 |
| 847.5000 (D = 16) | 4 | 16 | N/A |

In the Vicinity mode, spreading codes are chosen as depicted in Table 4. The number of cycles per coded bit is fixed to N=128 for Vicinity types V2 and V8. Therefore, $f_{cb}=f_c/N=f_c/128$.

TABLE 4

Line Coder Look-up Table for Vicinity mode

| Vicinity Type | $b_7$ | $b_6$ | $b_5$ | $b_4$ | $b_3$ | $b_2$ | $b_1$ | $b_0$ | Coded Bit | | | | | | $N_{cb}$ (per bit) |
|---|---|---|---|---|---|---|---|---|---|---|---|---|---|---|---|
| V2 | | | | | | | 0 | 0 | 10 | 11 | 11 | 11 | | | 4 |
| (1 out of 4) | | | | | | | 0 | 1 | 11 | 10 | 11 | 11 | | | 4 |
| | | | | | | | 1 | 0 | 11 | 11 | 10 | 11 | | | 4 |
| | | | | | | | 1 | 1 | 11 | 11 | 11 | 10 | | | |
| V8 | 0 | 0 | 0 | 0 | 0 | 0 | 0 | 0 | 10 | 11 | 11 | 11 | ... | 11 | 64 |
| (1 out of 256) | 0 | 0 | 0 | 0 | 0 | 0 | 0 | 1 | 11 | 10 | 11 | 11 | ... | 11 | 64 |
| | 0 | 0 | 0 | 0 | 0 | 0 | 1 | 0 | 11 | 11 | 10 | 11 | ... | 11 | 64 |
| | 0 | 0 | 0 | 0 | 0 | 0 | 1 | 1 | 11 | 11 | 11 | 10 | ... | 11 | 64 |
| | | | | ... | | | | | | | ... | | | | ... |
| | 1 | 1 | 1 | 1 | 1 | 1 | 1 | 1 | 11 | 11 | 11 | 11 | ... | 10 | 64 |

Table 5 depicts the Vicinity frame structure.

TABLE 5

Vicinity frame structure

| Type | Start of Frame | Data | End of Frame |
|---|---|---|---|
| V2 | 01111011 | xxxxx ... xxxxxx | 1101 |
| V8 | 01111110 | xxxxx ... xxxxxx | 1101 |

For V2, every 2 bits maps into 8 coded bits therefore the number of coded bits per bit $N_{cb}=4$. For V8, every 8 bits maps into 512 coded bits, thus $N_{cb}=64$.

The data rate can be calculated as $$f_b = \frac{f_{cb}}{N_{cb}}.$$

The vicinity moue supports two data rates: a high data rate of $f_c/2^9$ for V2 and a low data rate of $f_c/2^{13}$ for V8. Table 6 depicts these parameters.

TABLE 6

Vicinity parameters

| Type | N | $f_{cb}$ | $N_{cb}$ (per bit) | $f_b$ |
|---|---|---|---|---|
| V2 | 128 | $f_c/128$ | 4 | $f_c/512$ |
| V8 | 128 | $f_c/128$ | 64 | $f_c/8192$ |

For some implementations, the initiator subsystem 310 generates two waveforms MP1 and MP2 used as the two inputs for amplifier 320. These waveforms may be generated using a clock at 32 times the carrier frequency. Processor 312 reads a bit pattern from one of sixteen MP1 storage locations in memory 314. Each cycle of this periodic waveform can be represented by a pattern of 32 bits. For example:
MP1: 1111111111111111 0000000000000000

The MP2 waveform is also generated using 32-bit patterns stored in one of the sixteen storage locations for MP2. The location or address (and so the pattern) may change from one cycle to the next cycle. One cycle of an MP2 waveform could be:
MP2: 1000000000000001 0111111111111110

Figure 6:
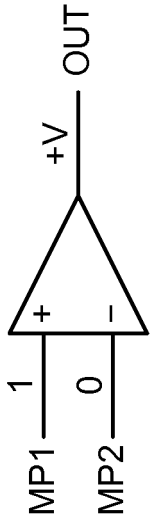
FIG. 6 is a schematic that depicts amplifier outputs for different inputs.

Amplifier 320 forms differential output OUT=v(MP1−MP2), where v is the gain of the amplifier. There are three possible outputs of 0, +v and −v as shown in FIG. 6.

Figure 7:
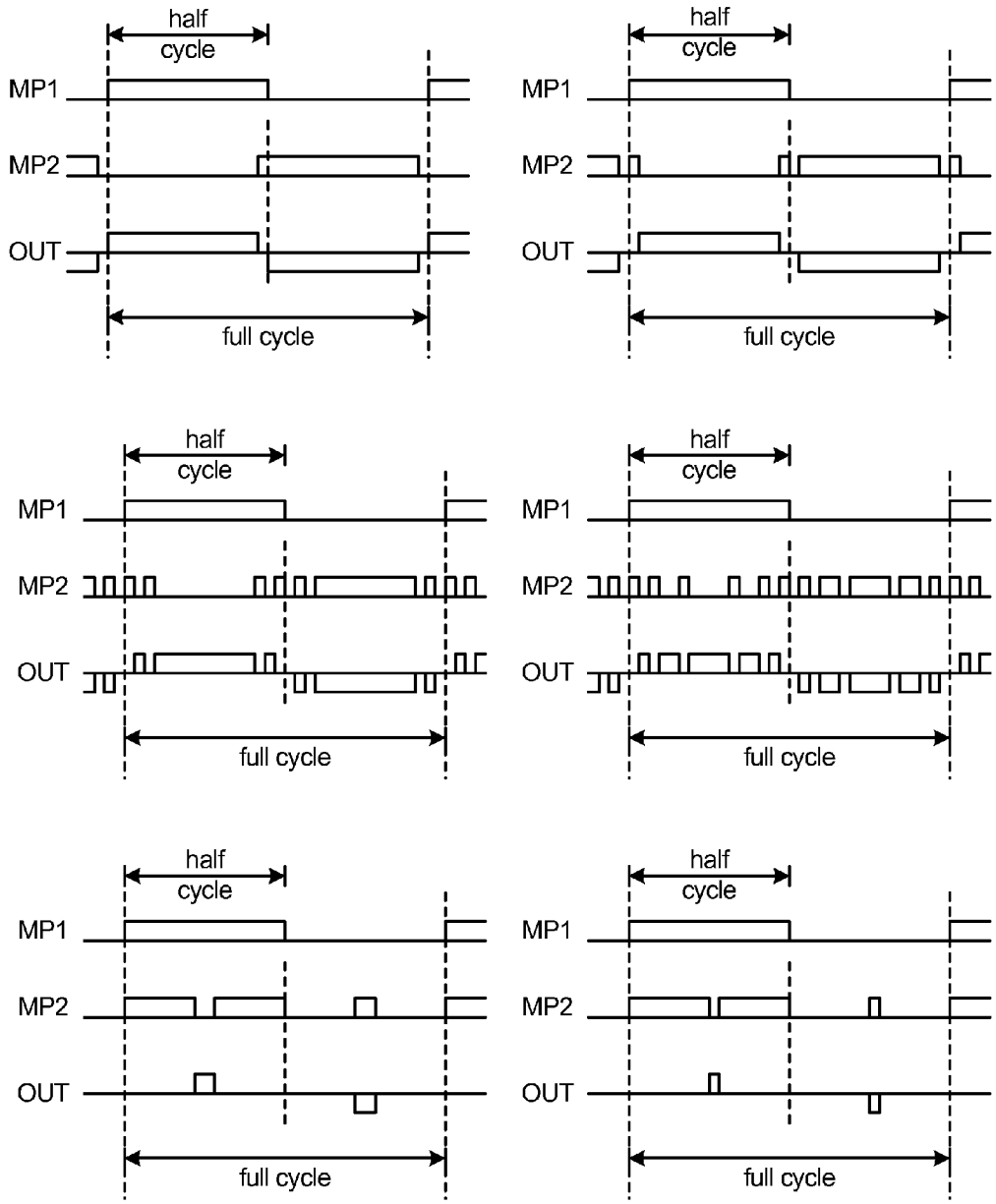
FIG. 7 is a set of six timing diagrams illustrating examples of a range of outputs for different pulse code modulated signals.

The bit patterns are used to generate the waveform in a desired shape. Once a desired shape of an output waveform is identified, proper bit pattern pairs that achieve the desired output waveform can be determined. Some examples of bit patterns and the corresponding shape of output waveforms each based on two bit patterns are illustrated in FIG. 7.

Table 7 shows how examples of pairs of bit patterns and the resulting PWM waveform that can be generated using the bit patterns. The pulse width of the waveform increases progressively in FIG. 7 as a result of the selected bit patterns. Each coded bit is represented by a given bit pattern.

TABLE 7
Bit-patterns that generate a PWM waveform
| address | bit pattern | PWM Waveform output |
|---|---|---|
| 0 | MP1: FFFF0000<br>MP2: FFFF0000 | — |
| 1 | MP1: FFFF0000<br>MP2: FFFE0001 |  |
| 2 | MP1: FFFF0000<br>MP2: FFFB0003 |  |
| 3 | MP1: FFFF0000<br>MP2: FFF80007 | 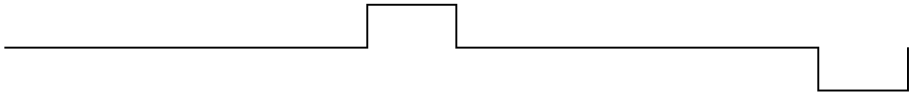 |
| 4 | MP1: FFFF0000<br>MP2: FFF0000F |  |
| 5 | MP1: FFFF0000<br>MP2: FFE0001F |  |
| 6 | MP1: FFFF0000<br>MP2: FFB0003F |  |
| 7 | MP1: FFFF0000<br>MP2: FF80007F |  |
| 8 | MP1: FFFF0000<br>MP2: FF0000FF |  |
| 9 | MP1: FFFF0000<br>MP2: FE0001FF |  |
| 10 | MP1: FFFF0000<br>MP2: FB0003FF |  |
| 11 | MP1: FFFF0000<br>MP2: F80007FF | 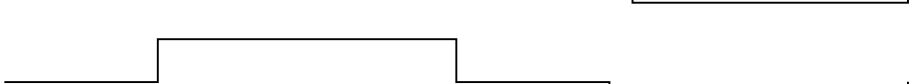 |
| 12 | MP1: FFFF0000<br>MP2: F0000FFF | 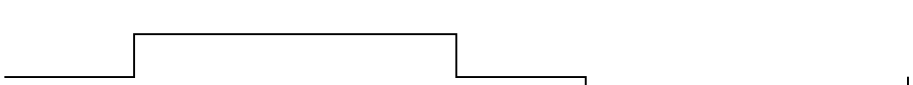 |
| 13 | MP1: FFFF0000<br>MP2: E0001FFF |  |

TABLE 7-continued

Bit-patterns that generate a PWM waveform

| address | bit pattern | PWM Waveform output |
|---|---|---|
| 14 | MP1: FFFF0000<br>MP2: B0003FFF | |
| 15 | MP1: FFFF0000<br>MP2: 80007FFF | |

Transitions between different symbol values or phases may cause overshoot or undershoot. More gradual transitions increase transition time (ramp up or ramp down), but can reduce overshoot and undershoot. For example, coded bits 0 and 1 may be represented by the bit patterns at address 0 and address 15 in Table 7, respectively. A transition in one step, from address 0 to address 15 may result in excessive undershoot and overshoot. A more gradual transition can reduce overshoot and undershoot. For example, a transition in 3 steps (addresses 0, 5, 10, and then 15) takes three carrier cycles to transition from coded bit 0 to coded bit 1, but results in reduced overshoot and undershoot. Additional steps with more gradual transitions would further reduce overshoot and undershoot upon transition. For some implementations, the transition occurs in 16 steps. For some implementation, the transition occurs in as few as 4 steps, in 32 or more steps, or any number of steps in between.

FIG. 8 illustrates an example for a generation of a pulse wave modulated signal $V_O$ over a cycle of the carrier frequency, with signal inputs corresponding to MP1, MP2, MN1, and MN2. The generated signal in this example has a duty cycle $\delta$ of 7/16. For some implementations, the pulse wave modulated signal has a small delay with respect to the original MP1 and MP2 input signals.

FIG. 9 illustrates the four amplifier 320 states that are driven by input signals corresponding to MP1, MP2, MN1, and MN2. In state 1, $V_O=+v$, and current flows 402 in a positive cycle from $V_{DD}$ through PMOS switch Mp1, into the positive terminal of the inductor, and from the negative current of the inductor through NMOS switch Mn2 to ground. In state 3, $V_O=-v$, and current flows 404 in a negative cycle from $V_{DD}$ through PMOS switch Mp2, into the negative terminal of the inductor, and from the positive terminal of the inductor through the NMOS switch Mn1 to ground. During states 2 and 4, $V_O=0$. During state 4, switches Mp1 and Mp2 are closed and any capacitors connected to nodes (+) and (−) charge up. During state 2, switches Mn1 and Mn2 are closed and the capacitors discharge to ground, consuming common mode current.

Figure 10A:
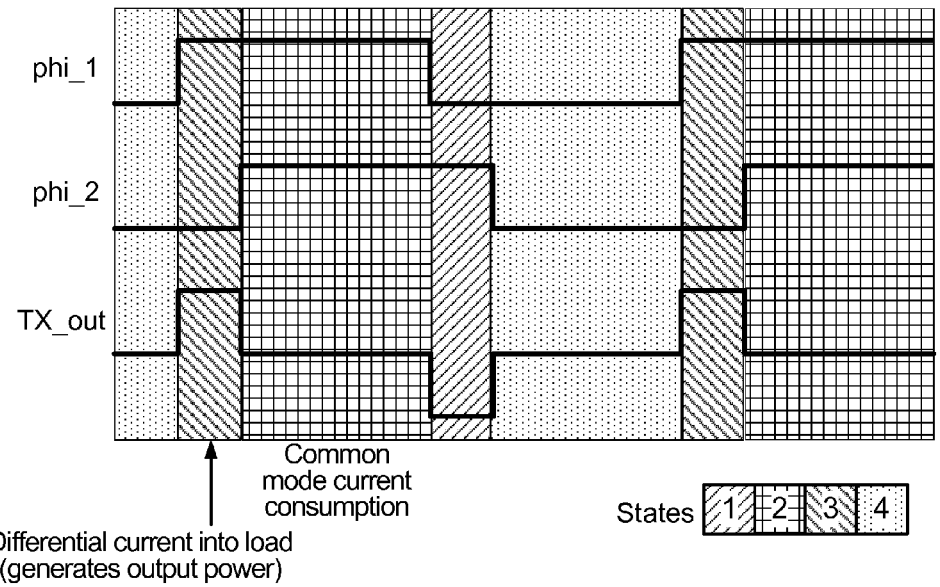
FIGS. 10A and 10B illustrate examples of timing diagrams that shows that a signal with a 50% duty cycle consumes more common mode current than a signal with a shorter duty cycle.
Figure 10B:
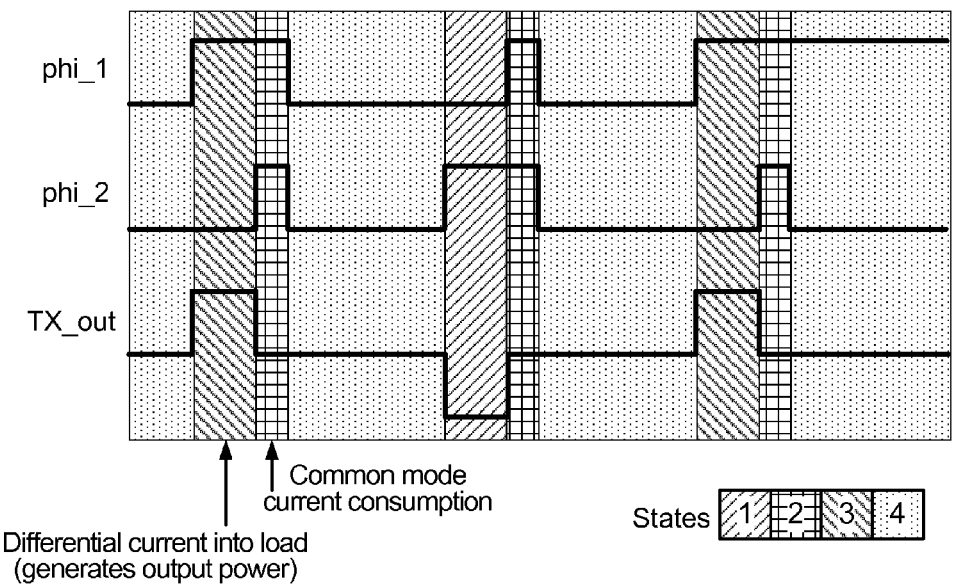

Reducing the time that amplifier 320 operates in state 2 reduces common mode current consumption. In FIG. 10A, input signals phi_1 and phi_2 each have 50% duty cycles. The amplifier 320 operates in state 2 and state 4 for similar amounts of time to produce output signal TX_out. In contrast, the inputs signals phi_1 and phi_2 in FIG. 10B each have duty cycles under 50% to produce output signal TX_out. The amplifier 320 operates significantly less time in state 2 than in state 4 to produce output signal TX_out, resulting in a significant reduction in common mode current consumed when compared with FIG. 10A.

Figure 11:
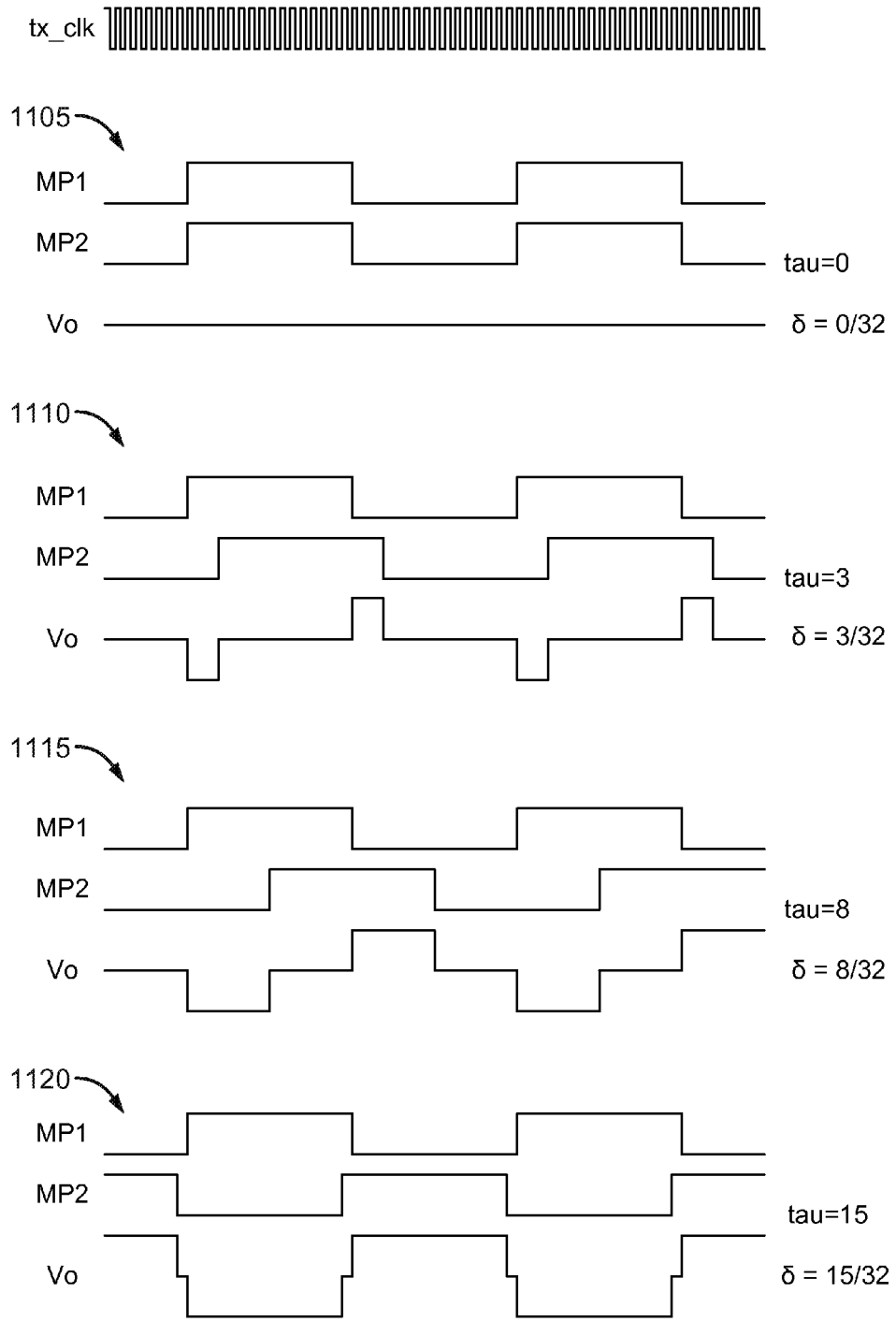
FIG. 11 depicts examples of pulse wave modulated signals with duty cycles of 0, 3/32, 8/32, and 15/32.

FIG. 11 illustrates example graphs illustrating pairs of input signals MP1 and MP2 with resultant output signals output signals $V_O$. In graph 1105, the two input signals are identical. The difference MP2−MP1 is zero throughout the period, resulting in an output duty cycle $\delta=0/32$. In graph 1110, MP2 is delayed by 3 transmit clock cycles ($\tau=3$). The resultant output signal $V_O$ has a duty cycle $\delta=3/32$, with a value of −1 when MP1 exceeds MP2 and +1 when MP1 is less than MP2. In graph 1115, $\tau=8$. This larger delay between MP1 and MP2 results in an output duty cycle $\delta=8/32$ for $V_O$. In graph 1120, $\tau=15$. Signals MP1 and MP2 have opposite values over most of the period, resulting in an output duty cycle of $\delta=15/32$. The pulse wave modulated signal goes through a matching network 330 that acts as a band-pass filter. Assuming an ideal bandpass filter, only the first harmonic will be passed, generated from input signals with 50% duty cycles.

Figure 12:
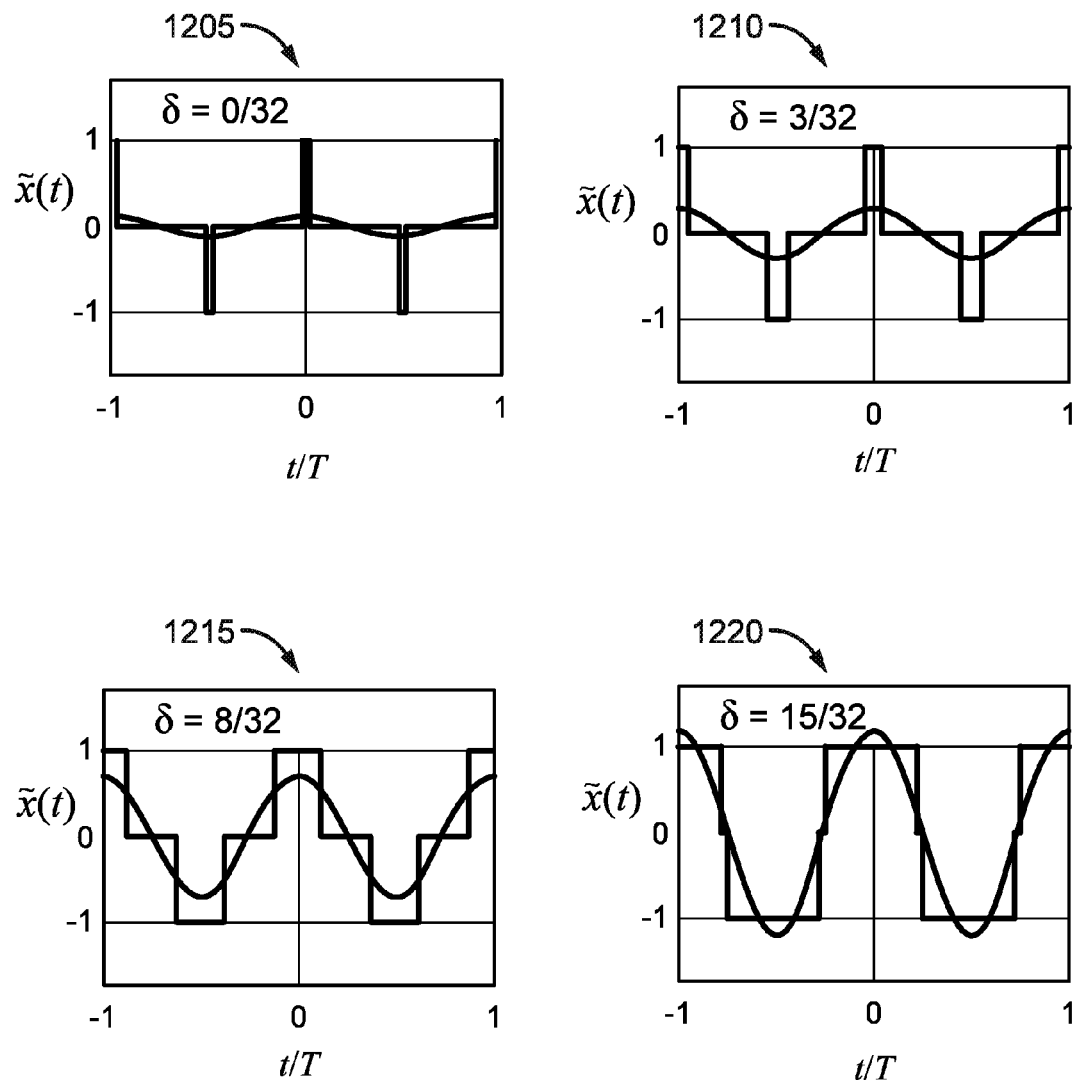
FIG. 12 illustrates an example of a set of plots of pulse wave modulated signals and their first harmonics, over a range of duty cycles.

FIG. 12 depicts example graphs illustrating the relationship between duty cycle $\delta$ and the filtered signal. In graph 1205, $\delta=0/32$. The signal x(t) has lower magnitude than signals with higher duty cycles. In graph 1210, $\delta=3/32$, corresponding to graph 1110 in FIG. 11. The signal x(t) reaches higher magnitudes over the period than the signal in graph 1205. Graph 1215, with $\delta=8/32$, corresponds to graph 1115 in FIG. 11. Graph 1220, with $\delta=15/32$, corresponds to graph 1120 in FIG. 11. As the duty cycle increases, the strength of the first harmonic also increases. The pulse width modulated signal can be used to generate NFC transmit signal for all types and data rates. In order to do that a signal of duty cycle $\delta_0$ is used to transmit coded bit "0" and a pulse width modulated signal of duty cycle $\delta_1$ is used to transmit coded bit "1". For example, assume a duty cycle of 15/32 for coded bit "1" ($\delta_1=15/32$). Varying the duty cycle $\delta_0$ for coded bit "0" results in varying modulation indexes, as shown in Table 8.

TABLE 8

Exemplary relationship between duty cycle and modulation index

| $\delta_0$ | modulation index |
|---|---|
| 0/32 | 1.0000 |
| 1/32 | 0.8207 |
| 2/32 | 0.6722 |
| 3/32 | 0.5484 |
| 4/32 | 0.4445 |
| 5/32 | 0.3571 |
| 6/32 | 0.2835 |
| 7/32 | 0.2214 |
| 8/32 | 0.1692 |
| 9/32 | 0.1257 |
| 10/32 | 0.0896 |
| 11/32 | 0.0603 |
| 12/32 | 0.0372 |
| 13/32 | 0.0196 |

TABLE 8-continued

Exemplary relationship between duty cycle and modulation index

| $\delta_0$ | modulation index |
|---|---|
| 14/32 | 0.0073 |
| 15/32 | 0 |

Figure 13:
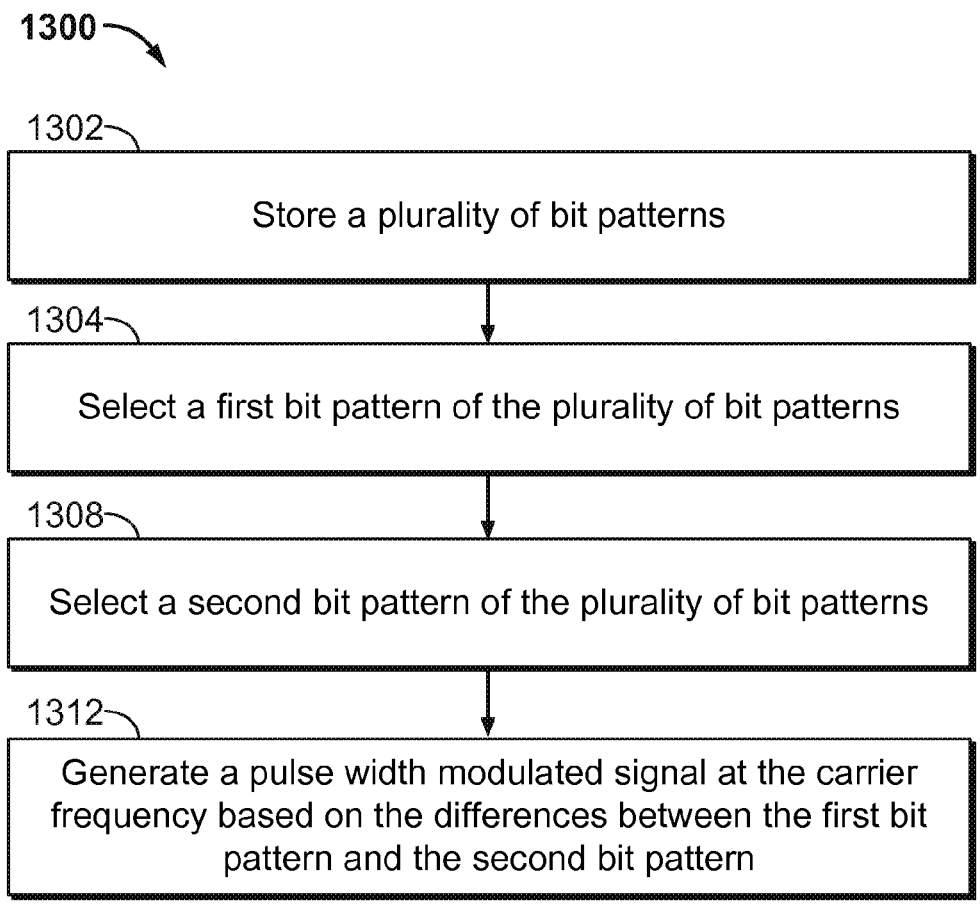
FIG. 13 is a flowchart depicting an implementation of a process for shaping a signal for near field communications.

FIG. 13 is a flowchart depicting a process for shaping a signal for near field communications. Block 1302 depicts the step of storing a plurality of bit patterns. Block 1304 depicts selecting a first bit pattern from the plurality of bit patterns, which is used to generate a first waveform (MP1) with pulse patterns corresponding to the first selected bit pattern. Blocs 1308 depicts selecting a second bit pattern from the plurality of bit patterns which is used to generate a second waveform (MP2) with pulse patterns corresponding to the second selected bit pattern. In block 1312, the process 1300 generates a pulse width modulated signal at the carrier frequency based on the difference between the first and second waveforms.

In some implementations, one or more memory units store the plurality of bit patterns. A first circuit selects the first bit pattern of the plurality of bit patterns. The first circuit generates the first waveform (MP1) with pulse patterns corresponding to the first selected bit pattern. The first circuit selects the second bit pattern of the plurality of bit patterns. The first circuit generates the second waveform (MP2) with pulse patterns corresponding to the second selected bit pattern. An amplifier generates a pulse width modulated signal at the carrier frequency based on the first waveform and the second waveform.

In some implementations, further steps comprise filtering the second circuit higher order harmonics of the pulse width modulated signal, and generating a near field communications (NFC) transmit signal. In some implementations, a second circuit filters higher order harmonics, and generates a near field communications (NFC) transmit signal. A transmitter transmits the near field communications (NFC) transmit signal. The bit patterns shape pulse width modulated signals to reduce higher order harmonics for each protocol, modulation index, and data rate combination.

In order to reduce overshoot and undershoot, some implementations define an N-element sequence of phase steps, wherein N exceeds 2. The first element corresponds to a first phase. The Nth element corresponds to a second phase. The second through N–1 elements correspond to different phase steps in the transition from the first phase to the second phase. The second through N–1 elements increase monotonically when the second phase exceeds the first phase. The second through N–1 elements decrease monotonically when the second phase is less than the first phase. Some implementations generate a shaped signal for each of the N-element sequence of phase steps, wherein the first bit pattern selected for each phase step and the second bit pattern for each phase step corresponds to the phase step, thereby reducing both undershoot and overshoot in the transition from the first phase to the second phase. N may vary between 3 and 32, depending on the transition time to reduce overshoot and undershoot.

Figure 14:
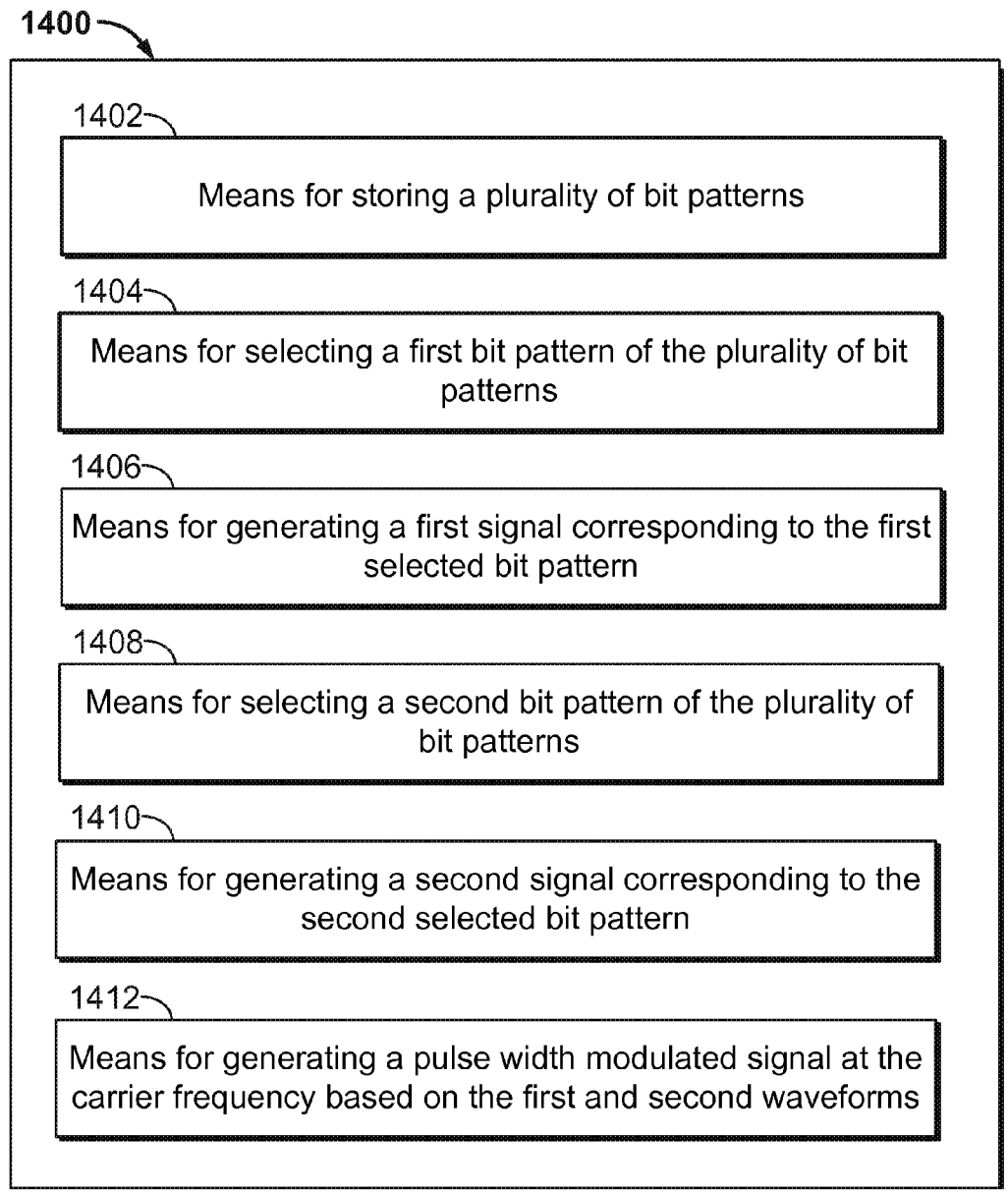
FIG. 14 depicts elements of a device used to shape a signal for near field communications, according to some implementations.

FIG. 14 depicts elements of a device used to shape a signal for near field communications. The device 1400 comprises means for storing a plurality of bit patterns 1402. The device 1400 further comprises means for selecting a first bit pattern from the plurality of bit patterns 1404 and means for generating a first signal with pulse patterns corresponding to the first selected bit pattern 1406. The device 1400 further comprises means for selecting a second bit pattern from the plurality of bit patterns 1408 and means for generating a second signal with pulse patterns corresponding to the second selected bit pattern 1410. The device 1400 further comprises means for generating a pulse width modulated signal at the carrier frequency based on the first and second waveforms 1412. For example, the pulse width modulated signal generating means 1412 may subtract one waveform from the other to form a differential output.

The plurality of bit patterns storing means 1402 may be configured to perform one or more of the functions described above with respect to the block 1302 illustrated in FIG. 13. The storing means 1402 may include one or more of the processor 312 and the memory 314, illustrated in FIG. 3. The means for selecting a first bit pattern 1404 may be configured to perform one or more of the functions described above with respect to the block 1304. The selecting means 1404 may include one or more of the processor 312 and the memory 314, illustrated in FIG. 3. The generating a first signal means 1406 may be configured to perform one or more of the functions described above with respect to the block 1312. The generating a first signal means 1406 may include one or more of the processor 312 and memory 314.

The selecting a second bit pattern means 1408 may be configured to perform one or more of the functions described above with respect to the block 1308. The selecting s second bit pattern means 1408 may include one or more of the processor 312 and the memory 314, illustrated in FIG. 3. The generating a second signal means 1410 may be configured to perform one or more of the functions described above with respect to the block 1312. The generating a second signal means 1410 may include one or more of the processor 312 and memory 314. The generating a pulse width modulated signal means 1412 for may be configured to perform one or more of the functions described above with respect to the block 1312. The generating a pulse width modulated signal means 1412 may include one or more of the processor 312, memory 314, RF analog block 316, LO Generator 318, and amplifier 320.

In some implementations, one or more memory units store the plurality of bit patterns. A first circuit selects the first bit pattern of the plurality of bit patterns. The first circuit generates the first waveform (MP1) with pulse patterns corresponding to the first selected bit pattern. The first circuit selects the second bit pattern of the plurality of bit patterns. The first circuit generates the second waveform (MP2) with pulse patterns corresponding to the second selected bit pattern. The amplifier generates a pulse width modulated signal at the carrier frequency based on the difference between the first waveform and the second waveform.

In some implementations, the device further comprises means for filtering the second circuit higher order harmonics of the pulse width modulated signal, and means for generating a near field communications (NFC) transmit signal. In some implementations, a second circuit filters higher order harmonics, and generates a near field communications (NFC) transmit signal. A transmitter provides means for transmitting the near field communications (NFC) transmit signal. The bit patterns shape pulse width modulated signals to reduce higher order harmonics for each protocol, modulation index, and data rate combination.

In order to reduce overshoot and undershoot, some implementations contain means for defining an N-element sequence of phase steps, wherein N exceeds 2. The first element corresponds to a first phase. The Nth element corresponds to a second phase. The second through N–1 elements correspond to different phase steps in the transition from the first phase to the second phase. The second through N–1 elements increase monotonically when the second phase exceeds the first phase. The second through N−1 elements decrease monotonically when the second phase is less than the first phase. Some implementations generate a shaped signal for each of the N-element sequence of phase steps, wherein the first bit pattern selected for each phase step and the second bit pattern for each phase step corresponds to the phase step, thereby reducing both undershoot and overshoot in the transition from the first phase to the second phase. N may vary between 3 and 32, depending on the transition time to reduce overshoot and undershoot.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations of the application.

The various illustrative blocks, modules, and circuits described in connection with the implementations disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the implementations disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor may read information from, and write information to, the storage medium. In the alternative, the storage medium may be integral to the processor. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the applications have been described herein. It is to be understood that not necessarily all such advantages may be achieved in accordance with any particular implementation of the application. Thus, the application may be embodied or carried out in a manner that achieves or optimizes one advantage or group of advantages as taught herein without necessarily achieving other advantages as may be taught or suggested herein.

Various modifications of the above described implementations may be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for wireless communications comprising:
a memory unit configured to store a plurality of bit patterns;
a first circuit configured to generate a first signal using a first selected one of the plurality of bit patterns, and configured to generate a second signal corresponding to a second selected one of the plurality of bit patterns; and
an amplifier coupled to the first circuit and configured to generate a pulse width modulated signal at a carrier frequency based on the first signal and the second signal.

2. The apparatus of claim 1, further comprising a second circuit configured to filter higher order harmonics of the pulse width modulated signal to generate a near field communications (NFC) transmit signal.

3. The apparatus of claim 1, wherein the plurality of bit patterns comprises bit patterns that shapes the pulse width modulated signal to reduce higher order harmonics for each protocol, modulation index, and data rate combination.

4. The apparatus of claim 1, wherein the amplifier is a class D power amplifier.

5. The apparatus of claim 1, wherein the first selected one of the plurality of bit patterns is selected based on whether a transmitted coded bit is a zero or a one, and the second selected one of the plurality of bit patterns is selected based on whether a transmitted coded bit is a zero or a one.

6. The apparatus of claim 1, wherein the first circuit is further configured to select one of the plurality of bit patterns for each cycle of the carrier frequency.

7. The apparatus of claim 1, wherein the plurality of bit patterns include bit patterns with a plurality of different duty cycles, including at least one bit pattern with a duty cycle under 50%.

8. The apparatus of claim 1, wherein the plurality of bit patterns includes bit patterns corresponding to different phase steps in the transition a first phase to a second phase.

9. The apparatus of claim 2, further comprising a transmitter operationally coupled to the second circuit, the transmitter configured to transmit the near field communications (NFC) transmit signal.

10. The apparatus of claim 2, wherein the second circuit is a matching network filter.

11. The apparatus of claim 2, wherein the near field communications (NFC) transmit signal is configured to be a Type A Proximity near field communications (NFC) signal having characteristics selected from one of the following: data rate of carrier frequency divided by 128 and a modulation index of 90% to 100%, data rate of carrier frequency divided by 64 and a modulation index of 25% to 100%, data rate of carrier frequency divided by 32 and a modulation index of 25% to 100%, or data rate of carrier frequency divided by 16 and a modulation index of 25% to 100%.

12. The apparatus of claim 2, wherein the near field communications (NFC) transmit signal is configured to be a Type B Proximity near field communications signal having a modulation index of 8% to 15% and data rate selected from one of the following: carrier frequency divided by 128, carrier frequency divided by 64, carrier frequency divided by 32, or carrier frequency divided by 16.

13. The apparatus of claim 2, wherein the near field communications (NFC) transmit signal configured to be a Type F Proximity near field communications signal having characteristics selected from one of the following: data rate of carrier frequency divided by 64 and a modulation index of 8% to 14%, or data rate of carrier frequency divided by 32 and a modulation index of 8% to 14%.

14. The apparatus of claim 2, wherein the near field communications (NFC) transmit signal is configured to be a Vicinity near field communications signal with characteristics selected from one of the following: data rate of carrier frequency divided by 512 and a modulation index of 10% to 100%, and carrier frequency divided by 8192 and a modulation index of 10% to 100%.

15. The apparatus of claim 3, wherein each of the plurality of bit patterns contains 32 bits.

16. The apparatus of claim 8, wherein the first circuit is configured to first select the one of the plurality of bit patterns corresponding to the first phase, then select one of the plurality of bit patterns corresponding to different phase steps in the transition from the first phase to the second phase, and finally select one of the plurality of bit patterns corresponding to the second phase to reduce both undershoot and overshoot in phase transitions.

17. A method for shaping a signal for near field communications (NFC) comprising:
generating a shaped signal comprising
storing a plurality of bit patterns;
selecting a first bit pattern of the plurality of bit patterns;
selecting a second bit pattern of the plurality of bit patterns; and
generating a pulse width modulated signal at the carrier frequency based on the differences between the first bit pattern and the second bit pattern.

18. The method of claim 17, further comprising generating a first signal corresponding to the first selected bit pattern, generating a second signal corresponding to the second selected bit pattern, and wherein generating a pulse width modulated signal comprises inputting the first signal and the second signal to an amplifier, and wherein the pulse width modulated signal is an output signal from the amplifier.

19. The method of claim 17, further comprising:
filtering higher order harmonics of the pulse width modulated signal; and
generating a near field communications (NFC) transmit signal.

20. The method of claim 17, further comprising selecting a bit pattern from the plurality of bit patterns that shape the pulse width modulated signal, wherein the selected bit pattern is selected to reduce higher order harmonics for each protocol, modulation index, and data rate combination.

21. The method of claim 17, further comprising:
defining an N-element sequence of phase steps, wherein N exceeds 2, wherein the first element corresponds to a first phase, the Nth element corresponds to a second phase, and the second through N−1 element corresponds to different phase steps in the transition from the first phase to the second phase, the second through N−1 elements monotonically increasing when the second phase exceeds the first phase, the second through N−1 elements monotonically decreasing when the second phase is less than the first phase; and
generating a shaped signal for each of the N-element sequence of phase steps, wherein the first bit pattern selected for each phase step and the second bit pattern for each phase step corresponds to the phase step, thereby reducing both undershoot and overshoot in the transition from the first phase to the second phase.

22. The method of claim 19, further comprising transmitting the near field communications (NFC) transmit signal.

23. The method of claim 21, wherein the N-element sequence of phase steps contains an integer number of phase steps such that $3 \le N \le 32$.

24. A device for shaping a signal for near field communications (NFC) comprising:
a signal generator, comprising
means for storing a plurality of bit patterns;
means for selecting a first bit pattern of the plurality of bit patterns;
means for generating a first signal corresponding to the first selected bit pattern;
means for selecting a second bit pattern of the plurality of bit patterns;
means for generating a second signal corresponding to the second selected bit pattern; and
means for generating a pulse width modulated signal at the carrier frequency based on a first waveform and a second waveform.

25. The device of claim 24, wherein the means for storing a plurality of bit patterns comprises a memory unit, the means for selecting a first bit pattern comprises a first circuit, the means for generating a first signal comprises the first circuit, the means for selecting a second bit pattern comprises the first circuit, the means for generating a second signal comprises the first circuit, and the means for generating a pulse width modulated signal comprises an amplifier.

26. The device of claim 24, further comprising:
means for filtering higher order harmonics of the pulse width modulated signal; and
means for generating a near field communications transmit signal from the filtered pulse width modulation signal.

27. The device of claim 26, wherein the means for filtering higher order harmonics comprises a second circuit, and the means for generating a near field communications transmit signal comprises the second circuit.

28. A non-transitory computer-readable medium comprising instructions that, when executed, causes an apparatus to:
generate a shaped signal by causing the apparatus to
store by a memory unit a plurality of bit patterns;
select by a first circuit a first bit pattern of the plurality of bit patterns;
generate by a first circuit a first signal corresponding to the first selected bit pattern;
select by a first circuit a second bit pattern of the plurality of bit patterns;
generate by a first circuit a second signal corresponding to the second selected bit pattern; and
generate by an amplifier a pulse width modulated signal at the carrier frequency based on the first signal and the second signal.

29. The non-transitory computer-readable medium of claim 28, further comprising instructions that, when executed, causes an apparatus to:

filter by a second circuit higher order harmonics of the pulse width modulated signal; and generate by the second circuit a near field communications (NFC) transmit signal.

30. A processor for wireless communications, comprising:

a memory unit configured to store a plurality of bit patterns;

circuitry configured to generate a first signal corresponding to a first selected one of the plurality of bit patterns, and configured to generate a second signal corresponding to a second selected one of the plurality of bit patterns; and an amplifier coupled to the circuitry and configured to generate a pulse width modulated signal at a carrier frequency based on the first signal and the second signal.

* * * * *